United States Patent
Tammelin

[11] Patent Number: 5,838,755
[45] Date of Patent: Nov. 17, 1998

[54] FREQUENCY FORMING CIRCUIT WITH PULSE SWALLOWER

[75] Inventor: Saila Tammelin, Oulu, Finland

[73] Assignee: Nokia Mobile Phones Limited, Salo, Finland

[21] Appl. No.: 762,416

[22] Filed: Dec. 9, 1996

[30] Foreign Application Priority Data

Dec. 11, 1995 [FI] Finland ..................................... 955923

[51] Int. Cl.$^6$ ................................................... H03K 21/00
[52] U.S. Cl. ........................... 377/48; 327/115; 327/175; 327/284
[58] Field of Search .............. 377/48; 327/115, 327/175, 284

[56] References Cited

U.S. PATENT DOCUMENTS

| | | | |
|---|---|---|---|
| 5,093,632 | 3/1992 | Hietala et al. | 377/48 |
| 5,160,900 | 11/1992 | Visuri | 331/18 |
| 5,202,642 | 4/1993 | Dixon | 327/114 |
| 5,291,474 | 3/1994 | Ikonen et al. | 370/30 |
| 5,301,367 | 4/1994 | Heinonen | 455/76 |
| 5,349,622 | 9/1994 | Gorisse | 377/52 |

FOREIGN PATENT DOCUMENTS

| | | |
|---|---|---|
| 0 373 768 | 6/1990 | European Pat. Off. . |
| 0 403 047 A3 | 12/1990 | European Pat. Off. . |
| 0 606 979 A3 | 7/1994 | European Pat. Off. . |
| 0 645 888 A1 | 3/1995 | European Pat. Off. . |
| 0 682 411 A1 | 11/1995 | European Pat. Off. . |
| WO 90/07232 | 6/1990 | WIPO . |

*Primary Examiner*—Margaret Rose Wambach
*Attorney, Agent, or Firm*—Perman & Green, LLP

[57] ABSTRACT

A frequency forming circuit according to the present invention utilizes division by a partial fraction a/b, and therein pulse removal means (2) first remove a–b pulses from the end of each consecutive period equal in length to a pulses. Thereafter, the pulse string is conducted to a digital delay line (4) consisting of serially connected, controllable elements (5) that produce essentially the same unit delay, and which includes an intermediate output before each element. Each pulse in said period is output from the delay line (4) before the element (5) whose ordinal number in the delay line is the same as the ordinal number of the pulse in said period. A multiplexer (7) receives the pulses from the intermediate outputs of the digital delay line and combines them to form a new pulse string. Control means (6) cause the control elements (5) of the digital delay line (4) to produce an average unit delay $(a-b)*t/b$ with the same control.

4 Claims, 3 Drawing Sheets

FREQUENCY FORMING CIRCUIT WITH PULSE SWALLOWER

BACKGROUND OF THE INVENTION

1. Field of the Invention

The present invention is related to a frequency forming circuit that forms a new frequency from a received frequency by dividing the received frequency by a partial fraction.

2. Description of the Prior Art

In electronics applications, required frequencies usually are formed by means of a crystal reserved for that purpose or from a suitable crystal frequency by means of a phase-locked loop built around a voltage-controlled oscillator. Said solutions produce high-quality frequencies with pure spectra, but they are not very advantageous because of the space they require and their production cost. A crystal is a discrete component that requires a relatively large space and advantageous realization of a voltage-controlled oscillator integrated with other circuits is problematic.

In radio telephones, for example, clock frequencies of a carrier frequency circuit, which are noticeably lower than frequencies required by an RF circuit, can be formed by means of phase-locked loops from the same reference crystal frequency as RF frequencies are formed, or by dividing the already formed frequencies with suitable digital dividers. The most expensive alternative is to use a separate crystal to form each required frequency. By dividing a reference frequency or voltage-controlled oscillator frequencies, for example, it is possible to easily form new lower frequencies, if the new frequencies can be obtained by dividing by a whole number. If the newly formed frequency must be accurate, as a modem clock must be, for example, it is unlikely that a suitable frequency can be found from which the new frequency can be obtained by division by a whole number. If it were necessary to divide a very high frequency, a very power-consuming high-frequency division would have to be used. One alternative would be to find a suitable partial fraction by which the required frequency could be obtained from an available frequency.

It is known that a pulse frequency can be divided by a partial fraction a/b by removing ( a–b) pulses from each period of the pulse string equal in length to a pulses. This produces a frequency that is correct, on average, during each period equal in length to the original pulse a, but the problem is that the momentary frequency varies, and even though the variation were within the required frequency accuracy limits, it causes strong sidebands in the spectrum. Sidebands cause serious problems in many applications. In mobile telephones, for example, which include many radio-frequency parts, sideband frequencies and their mixing products with other frequencies cause disturbances and in the worst cases can even block speech channels. To avoid these problems, a frequency forming circuit based on partial fraction division is needed in which the result of the partial fraction division has as pure a spectrum as possible.

SUMMARY OF THE INVENTION

A frequency forming circuit according to the present invention, which receives a first pulse string having a first frequency and period t, for forming a second pulse string having a second frequency equal to the first frequency divided by a partial fraction k*a/b, where k, a and b are whole numbers and a is greater than b, is characterized in that it includes means receiving the first pulse string for removing a–b pulses from the end of each consecutive period of the first pulse string equal in length to a pulses, a digital delay line for receiving the pulse string thereafter, consisting of serially connected, controllable elements that produce essentially the same unit delay, and which includes an intermediate output before each element for outputting each pulse from the delay line before an element whose ordinal number in the delay line equals the ordinal number of said pulse in the pulse string, a multiplexer for receiving pulses from the intermediate outputs of the delay line and combining them to form a new pulse string and means for controlling the elements forming the digital delay line to produce an average unit delay (a–b)*t/b with the same control.

If division by a whole number is also performed in a frequency forming circuit according to the present invention, in other words, k is greater than 1, it also includes a frequency divider with a divisor equal to k for dividing the pulse string.

In an advantageous embodiment of a frequency forming circuit according to the present invention, the elements of the digital delay line are elements made up of consecutive MOS inverters that include a driver transistor, and the means of control include means for controlling the gate voltage of the driver transistors.

An advantageous embodiment of a frequency forming circuit according to the present invention includes two essentially similar delay lines, which are alternately connected, one line to delay pulses and the other line to the controlling means for adjusting the delay of the elements.

A benefit of a frequency forming circuit according to the present invention is that it can be realized in an integrated circuit using conventional circuit technology that also can be used to realize other digital circuits. The solution according to the present invention produces a partial fraction division with a nearly pure spectrum without filtering. A sufficiently accurate and stable frequency for many applications is produced by means of partial fraction division with an essentially pure spectrum and continuous calibration of the digital delay line.

BRIEF DESCRIPTION OF THE DRAWING

The present invention is explained in more detail below with references to the accompanying drawings.

DETAILED DESCRIPTION OF THE PREFERRED EMBODIMENT

Formation of a modem clock frequency of an analog mobile telephone will be presented below as an application example of a frequency forming circuit according to the present invention. Accurate injection frequencies needed in a mobile telephone for RF mixers are formed by means of phase-locked loops by accurately locking the frequency and phase of voltage-controlled oscillators (VCO) to a reference crystal frequency. In addition to RF injection frequencies, clock frequencies are needed for a processor and modem.

The injection frequencies usually used in a mobile telephone receiver are the channel frequency ±45 MHz and 44,55 MHz, providing intermediate frequencies of 45 MHz and 45 KHz. A frequency of 90 MHz is also produced for transmitter mixing. If a crystal frequency of 14,85 MHz is selected, the other intermediate frequency of the receiver can be easily and advantageously formed by filtering from the third harmonic frequency of the crystal. The basis for modem clock frequency selection is that the following data speeds are available in analog mobile telephone systems: NMT system, 1200 baud FFSK, AMPS system, 10 kbit/s, and TACS system, 8 kbit/s. In order for the selected modem clock frequency to be suitable for all these systems, it must be a sufficiently large multiple of 120 KHz. A suitable frequency is 4,8 MHz, for example, from which each required clock frequency is easily formed by means of a programmable divider.

Said universally suitable 4,8 MHz modem clock frequency can be formed from the reference crystal frequency by means of partial fraction division by dividing it by the number $99/32$. In this case, the partial fraction division can be simplified, because the numerator can be divided into factors 3 and 33, of which 33 is still greater than 32. In other words, the division can be divided into two parts, a division by a partial fraction $33/32$ and a division by a whole number 3. More generally expressed, it can be said that the division is performed by the number $k*a/b$, where k, a and b are whole numbers and a>b, in other words, a/b is a partial fraction. If the division cannot be advantageously divided in this way into divisions by a partial fraction and a whole number, in other words, more generally expressed, if k=1, then division is only performed by the partial fraction a/b.

Figure 1:
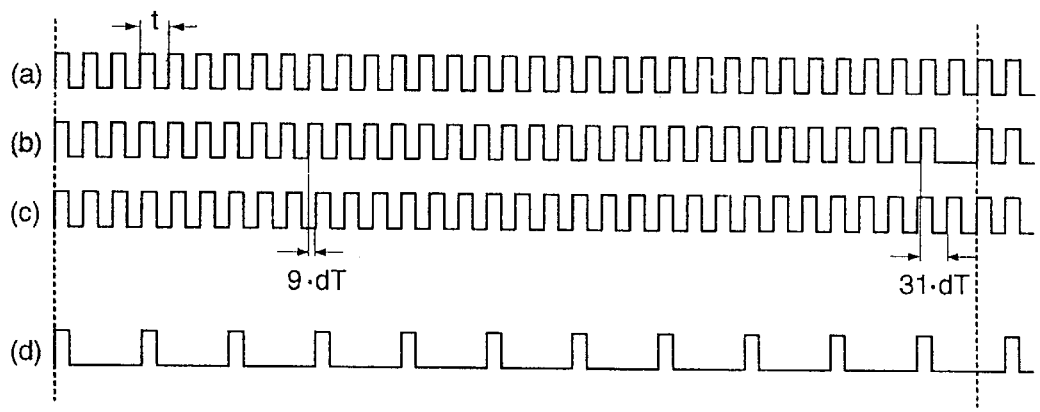
FIG. 1 is a diagrammatic presentation that pictures a case example of frequency formation according to the present invention.

The diagram in FIG. 1 illustrates the operation of a frequency forming circuit according to the present invention in the example presented above, in which the modem clock frequency is formed by dividing the reference crystal frequency by the above-mentioned number $99/32$, in other words, first by the partial fraction $33/32$ and then by the whole number 3. The pulse stream to be divided (a), which has a period t, is divided by the partial fraction $33/32$ by removing the last pulse of each period of 33 pulses in the manner indicated by pulse string (b). Then, all the pulses of said period are evenly distributed within said period by delaying the second pulse of said period by a suitable unit delay dT, the third pulse by two unit delays, and so on, as shown in the diagram, the tenth pulse by a delay of $9*dT$ and the thirty-second pulse by a delay of $31*dT$. Thus, the pulses within said period are delayed by $(n-1)*dT$, where n is the ordinal number of a pulse in said period. The unit delay dT that evenly distributes the pulses within said period is obtained from the expression $(a-b)*t/b$.

Figure 2:
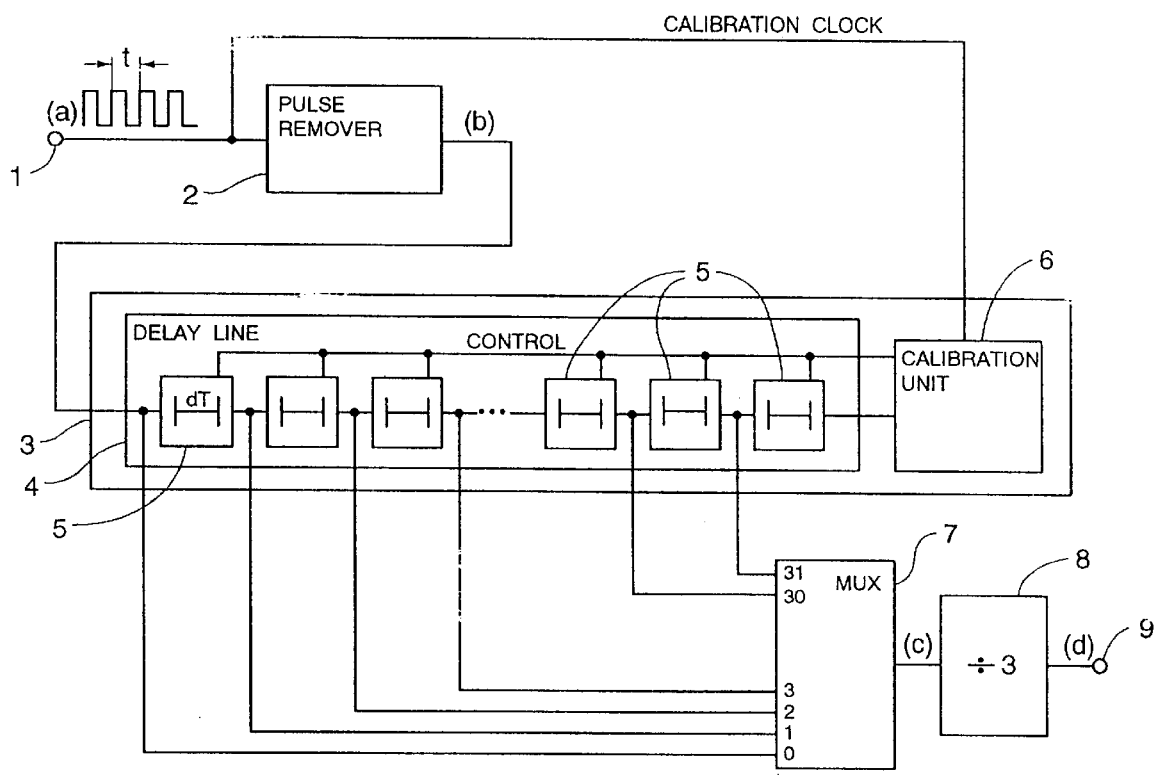
FIG. 2 is a block diagram of an embodiment of a frequency forming circuit according to the present invention by which frequency formation according to the diagram in FIG. 1 can be realized.

FIG. 2 presents a block diagram of a frequency forming circuit according to the present invention by which frequency formation according to the diagram in FIG. 1 can be realized. In this case, one pulse is removed from the end of each 33 pulse period of a pulse string (a) entering an input of the circuit. The resulting pulse string (b) is conducted to a delay block 3, consisting of a digital delay line 4 and a calibration unit 6. The digital delay line 4 consists of controllable delay elements 5, of which each produces one unit delay dT. The first pulse of each period is conducted directly to a multiplexer 7, the next pulse is conducted from the digital delay line 4 after the first delay element, the next pulse, after the second delay element, and so on, until the thirty-second pulse is taken after the thirty-first delay element. Pulse outputting from the delay line 4 can thus be controlled with a simple up-counter that is synchronized with the other blocks of the circuit. A pulse string (c) obtained from the multiplexer 7, which combines the pulses obtained from the delay line 4, is divided in this case by the number 3 in a whole number divider 8, resulting in a pulse string (d) with a desired frequency at the output 9 of the frequency forming circuit.

Delay line 4 and its delay elements are controlled by means of a calibration unit 6. As the unit delay in this case is t/32, a 32 delay element delay is equal to the original pulse period t. In principle, calibration is implemented by comparing the delay of the controllable digital delay line of 32 delay elements with the original pulse period t in the calibration unit 6, which receives the pulse string (a) entering the circuit as a calibration clock on the one hand, and the delayed pulse of said delay line on the other hand. The calibration unit 6 controls the delay line 4 so as to keep the length of the total delay equal to one original pulse period. The delay of each delay element is not controlled separately to make it stay equal to the unit delay, but each delay element receives the same control, keeping the total delay of the digital delay line at the desired length. The average delay of the delay elements within the delay line thus remains at the desired length, but the unit delays vary within the limits of accuracy obtainable with the identical delay elements.

Figure 3:
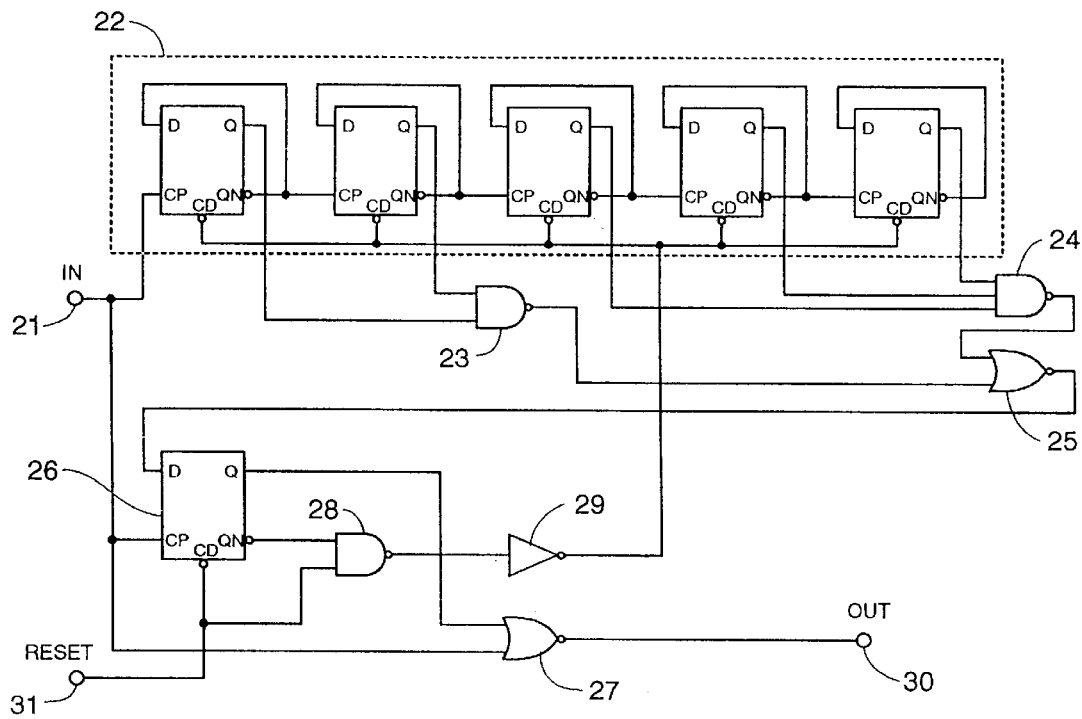
FIG. 3 presents an example of a realization of a pulse removal circuit of the frequency forming circuit shown in FIG. 2.

FIG. 3 presents a possible realization of a pulse removal circuit 2 examined in the above example. The pulse string entering the input 21 of the pulse removal circuit is conducted to a divider chain 22 consisting of D-flip-flops on the one hand, and a CP input of a D-flip-flop 26 and one input of a NOR gate 27 on the other hand. The divider chain 22 and gate circuits 23, 24, and 25 send a logical one to the D input of the D-flip-flop 26 at the thirty-second pulse, otherwise they send a logical zero. As the NOR gate 27 usually receives a logical zero at one of its inputs from the Q output of the D-flip-flop 26, and a pulse string at its other input, its output and the output of the whole pulse removal circuit 30 usually produces an inverted pulse string. However, in the period after the thirty-second pulse, the Q output sends a logical one, and as a result, the thirty-third pulse does not cause the state to change at the output of the NOR gate 27, thus removing the pulse from the pulse string. At the thirty-third pulse, the QN output of the D-flip-flop 26 resets the dividers of the divider chain 22 by means of a NAND gate 28 and an inverter 29. The circuit then performs the same operation for the next 33 pulse period, and so on. The circuit is also fitted with a connection 31 to the reset input of the D-flip-flop and one input of the NAND gate 28, by which an external reset can be applied to the circuit. A person skilled in the art understands that this is just one possible way of realizing the desired pulse removal, and there are many practicable alternatives for realizing pulse removal in each application.

Figures 4, 5:
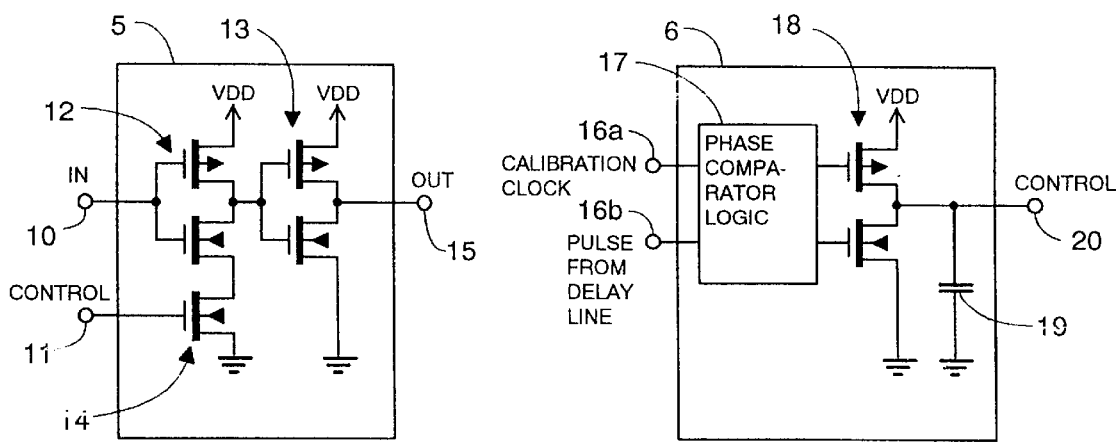
FIG. 4 presents an example of a realization of a unit delay element of a digital delay line of a frequency forming circuit according to the present invention.
FIG. 5 presents an example of a realization of a calibration circuit belonging to a frequency forming circuit according to the present invention.

FIG. 4 presents an example of a realization of a unit delay element that produces a unit delay. The basis for this realization is a CMOS inverter whose delay can be adjusted from 100 ps . . . 2 ns by means of known techniques. The number of inverters required by a delay element naturally depends on the length of the delay required in a given application, but in order not to change the phase it is advantageous to have an even number of inverters in the delay element. In the example under scrutiny, the required unit delay is t/32=1/14,85 MHz/32 @ 2,1 ns, and a suitable delay element 5 consists of two serial CMOS inverters 12 and 13 located between the input 10 and output 15 of the element. The delay can be controlled by regulating the discharge current of a transistor 14 by means of a control voltage connected to the gate of the transistor via a connector 11. The operating voltage VDD in this type of circuit can be in the range of 3 . . . 5 V and the control voltage can be in the magnitude of 1,5 V. A person skilled in the art understands that a delay line consisting of regulatable delay elements can be realized in other ways, and not only using MOS inverters, but the method presented herein and similar realizations are usable and advantageous in many applications, as CMOS technology and other similar circuit technologies are very common, and it is advantageous to realize the frequency forming circuit according to the present invention using the same circuit technology that is being used in any case.

FIG. 5 presents an example of a realization of a calibration circuit belonging to the embodiment of a frequency forming circuit according to the present invention presented above. The calibration circuit 6 receives a calibration clock on the one hand and a pulse coming from the delay line on the other hand at its inputs 16a and 16b. In this example under scrutiny, the pulse frequency arriving at the frequency forming circuit, the period of which is compared with the total delay produced by the delay line 4, functions as a calibration clock. The comparison is performed by phase comparator logic 17. The prerequisite here is that the pulse arriving at the delay line is synchronized with the calibration clock during calibration. The phase comparator logic 17 generates control signals for a charging circuit 18 by integrating a current pulse equal in length to the time difference between the edges of the calibration clock and the delayed pulse into a loop filter, which here is a capacitor 19. The direction of the current pulse depends on which of the edges in the phase comparator is ahead. An expert in the field understands that this simple and inexpensive realization of a calibration or delay line delay control is just one of many possibilities. For example, the output of the phase comparator can be converted to a control voltage regulation in many ways other than what was presented herein.

Figure 6:
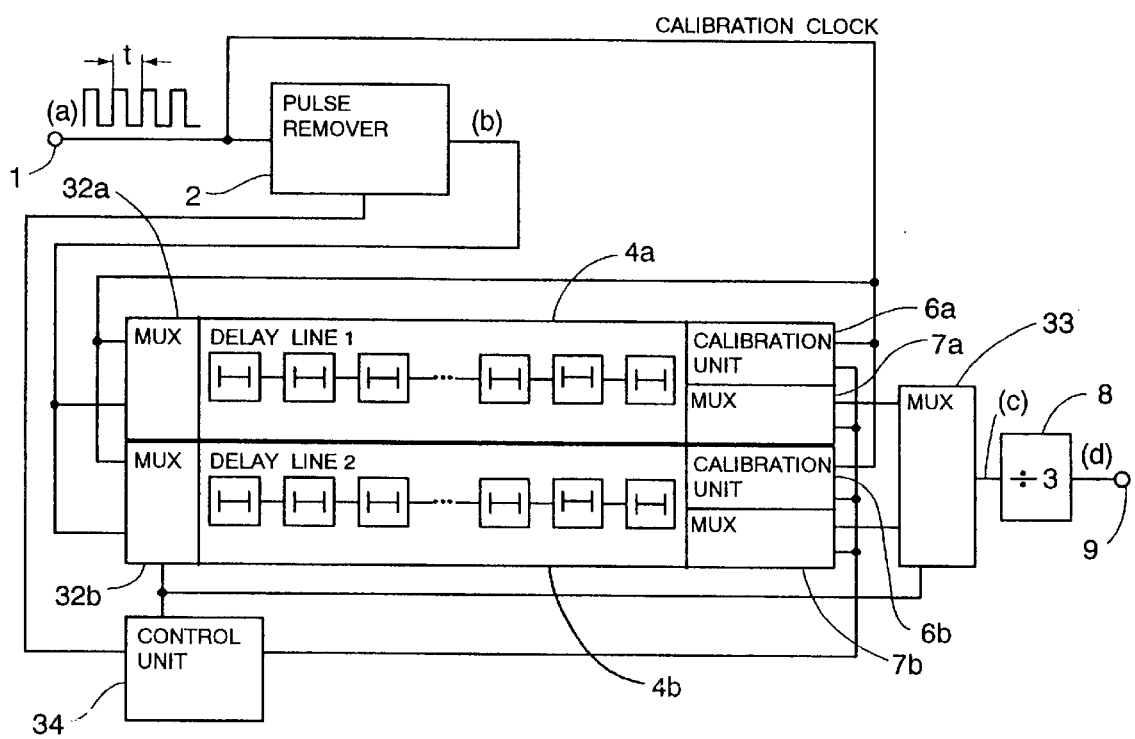
FIG. 6 is a simplified block diagram of another embodiment of a frequency forming circuit according to the present invention by which frequency formation according to the diagram in FIG. 1 can be realized.

As each pulse arriving at the delay line is delayed, practical realization of continuous calibration requires two parallel delay lines, which are alternately calibrated and used to delay pulses. FIG. 6 is diagrammatic presentation of an embodiment of a frequency forming circuit according to the present invention that realizes such a calibration. The inputs of two parallel delay lines 4a and 4b are connected respectively to two multiplexers 32a and 32b, which alternately connect a pulse string (b) and a calibration clock to the delay lines. The outputs of the delay lines 4a and 4b are connected to calibration units 6a and 6b and multiplexers 7a and 7b, as in the embodiment presented in FIG. 2, which combine the pulses obtained from the intermediate outputs of the delay line to form a pulse string. As the delay lines delay the pulses by turn, a multiplexer 33 is needed to combine the pulse strings obtained alternately from the delay lines to form one pulse string (c), which in this case is then divided by a whole number divider 8 to produce the required frequency. A control unit 34 controls the operation of the various units and controls the alternate operation of the delay lines by controlling the delay line input multiplexers 32a and 32b and the circuit output multiplexer 33.

As it was stated above, the delay elements of the digital delay line are controlled by regulating the delay of the whole delay line, so that actually the average value of the unit delays is continuously adjusted for correctness. Because, in practice, the delay elements are not completely identical, in other words, non-linearity exists in the delay line, some frequency jitter is created when a digital delay line is used to even the pulse frequency. A non-linearity error of 50 ps in a digital delay line can be reached with current manufacturing techniques, which corresponds to a delay line jitter amplitude of 25 ps. The rms value of the error is noticeably smaller. The accuracy requirement for a modem clock, which was scrutinized here as an application example, is 100 ppm, or a frequency error of 480 Hz. If the error is thought to occur only because of the non-linearity of the delay line, this corresponds to a 20 ps constant error in the delay line. Therefore, it is possible to reach the accuracy required by the scrutinized application by means of the above-mentioned embodiments of a frequency forming circuit according to the present application.

Examples of the realization and implementation in specific applications of a frequency forming circuit according to the present invention were presented above. References were also made to many alternatives for realizing the above-mentioned embodiments of the present invention, and the present invention naturally is not limited to said embodiments, either. For example, under certain conditions, the whole number division possibly performed in a frequency forming circuit according to the present invention may be situated before the delay of the pulse string.

The present invention may vary within the scope of the following claims.

I claim:

1. A frequency forming circuit, which receives a first pulse string having a first frequency and period t, for forming a second pulse string having a second frequency equal to the first frequency divided by a partial fraction k*a/b, where k, a and b are whole numbers and a is greater than b, is characterized in that it includes means (2) receiving the first pulse string for removing a–b pulses from the end of each consecutive period of the first pulse string equal in length to a pulses, a digital delay line (4) receiving the pulse string thereafter, consisting of serially connected, controllable elements (5) that produce essentially the same unit delay, and which includes an intermediate output before each element for outputting each pulse from the delay line before an element whose ordinal number in the delay line equals the ordinal number of said pulse in the pulse string, a multiplexer (7) for receiving pulses from the intermediate outputs of the delay line and combining them to form a new pulse string and means (6) for controlling the elements (5) forming the digital delay line (4) to produce an average unit delay (a–b)*t/b with the same control.

2. The frequency forming circuit according to claim 1, characterized in that when k is greater than 1, it also includes a frequency divider (8) with a divisor k that divides the pulse string.

3. The frequency forming circuit according to claim 1, characterized in that the elements of the digital delay line consists of consecutive MOS inverters, which include a driver transistor (14), and the means of control (6) include means (18, 19) for controlling the gate voltage of the driver transistor (14).

4. The frequency forming circuit according to claim 1, characterized in that it includes two essentially similar delay lines (4*a*, 4*b*), which are alternately connected, one to delay the pulses and the other to control means (6*a*, 6*b*) for regulating the delay of the elements.

* * * * *